United States Patent [19]

Youngquist

[11] Patent Number: 4,473,818
[45] Date of Patent: Sep. 25, 1984

[54] BIPOLAR DIGITAL TO ANALOG CONVERTER

[75] Inventor: Robert J. Youngquist, White Bear Lake, Minn.

[73] Assignee: Minnesota Mining and Manufacturing Company, St. Paul, Minn.

[21] Appl. No.: 320,546

[22] Filed: Nov. 12, 1981

[51] Int. Cl.³ .............................................. H03K 13/02
[52] U.S. Cl. ...................... 340/347 DA; 340/347 CC; 340/347 M
[58] Field of Search .................. 340/347 DA, 347 CC

[56] References Cited

U.S. PATENT DOCUMENTS

| | | | |
|---|---|---|---|
| 3,403,393 | 9/1968 | Skrenes | 340/347 DA |
| 3,582,939 | 6/1971 | Campbell | |
| 3,877,023 | 4/1975 | Spicer et al. | |
| 4,346,368 | 8/1982 | Johnson | 340/347 DA |

OTHER PUBLICATIONS

The Engineering Staff of Analog Devices, Inc., Analog-Digital Conversion Handbook, 6/1972, pp. I-55 to 59; II-32 to 43.

Sklar, 2's Complement Arithmetic Operations, Computer Design, vol. 11, No. 5, 5/1972, pp. 115-121.
Analog Devices, Inc., Data Acquisition Products Catalog, AD7520(AD7521), 10-bit(12-bit) D/A Converter, 1978, 2 Sheets+Cover.
The Engineering Staff of Analog Devices, Inc., Analog-Digital Conversion Handbook, 6/1972, p. II-44.

Primary Examiner—T. J. Sloyan
Attorney, Agent, or Firm—Donald M. Sell; James A. Smith; William D. Bauer

[57] ABSTRACT

A bipolar digital to analog converter having a pair of identically configured digital to analog networks, the outputs of which are summed. The input of these networks are connected by an appropriate control circuit which, depending upon whether the digital data is negative or positive, directs the data to one or the other of the networks, to progressively turn that network "on" or "off", depending upon whether the data is increasing or decreasing in its relative value, and biases the network not receiving the data either completely "off" or completely "on".

6 Claims, 5 Drawing Figures

BIPOLAR DIGITAL TO ANALOG CONVERTER

BACKGROUND OF THE INVENTION

This invention relates to digital to analog converters and in particular to bipolar converters having high accuracy at the zero crossover level.

Digital to analog converters are designed to reconstruct complex and dynamic analog wave forms, particularly audio or acoustic signals, from digital data. When these signals are bipolar, i.e., operating both positively and negatively with respect to a zero crossover, the complexity required within the converter is greatly increased, usually with a loss in accuracy. In such signals, power occasionally peaks well above the RMS power level. There must, therefore, be a very large dynamic range to handle the bursts of higher amplitudes, as well as the ability to handle the wide range of frequency interest. Yet, accurately recreating such information from digital data requires exceptional small signal performance to handle the information near zero level or crossover without crossover distortion.

In appreciation of this problem, digital to analog converters have been developed which separate the digital input signal into a polarity digit and a number of digits representing the absolute magnitude of the digital number, i.e., the magnitude excluding the sign. When this is done, a unipolar digital to analog network can be used to convert the digital signal to its analog equivalent, and a switching or inverting/non-inverting amplifier can be used to restore the polarity to the signal once it has been converted, i.e., depending upon the polarity of the input signal, the output of the unipolar digital to analog network is either inverted or non-inverted. Although this circuit is able to improve the linearity of small signals in the center region of the full scale range, it requires a very accurate and costly inverting amplifier, and therefore tends to remain a limited solution.

Another alternative has been to utilize two digital to analog networks, one of which operates from a positive reference source and the other of which operates from a negative reference source. Depending upon the polarity of the input signal as determined by the sign digit, only one of the digital to analog networks is switched on, with its output being connected to a suitable operational amplifier. In this case only one or the other of the digital to analog converters is used at any given time, again to convert the absolute magnitude of the digital data, i.e., absent the polarity information. This circuit, however, requires that a positively operating digital to analog network be matched with a negatively operating digital to analog network. Since these two digital to analog networks are differently configured, it becomes increasingly difficult to find such a matched pair.

SUMMARY OF THE PRESENT INVENTION

The bipolar digital to analog converter of the present invention is able to provide relatively accurate conversion at the zero crossover point, as well as at higher magnitude levels without the need for a precise and costly operational amplifier, or matched pairs of positive and negative going digital to analog networks. This digital to analog converter does not require the digital data to be separated into a portion which corresponds to the absolute magnitude and a portion which corresponds to the polarity. Although the polarity or sign information must still be known in order to bias the converter, the converter of the present invention monitors the continuously changing relative value of the digital signal and proportionately changes its output signal in response thereto.

The present invention comprises a pair of identically configured digital to analog networks, each having a plurality of input connections for the value digits of the digital data, and an output connection from which an analog signal corresponding to the digital data can be derived. The output connections of the two networks are electrically connected by an appropriate circuit to sum the output signals derived therefrom. The input connections of the two networks are also connected by an appropriate circuit. This circuit however is responsive to the sign digit for directing the value digits to one or the other of the digital to analog networks. The circuit also establishes biasing states or biasing conditions for the networks, again in response to the sign digit. In a first of these states or conditions, the digital to analog network not receiving the value digits is biased with a sufficiently high voltage, i.e., a logic "1" condition, to be completely turned on and therefore have a maximum output. The other digital to analog network, i.e., the one receiving data is then turned on or off progressively, as a function of the increase or decrease, respectively, in the relative value of the changing value digits. In a second biasing condition, the digital to analog network not receiving the data is biased with a sufficiently low or logic "0" voltage, to be completely turned off and therefore have a minimum or zero output. The other network, i.e., the one receiving the data, is then progressively turned off or on as a function of the decrease or increase, respectively, in the relative value of the changing value digits.

If it is assumed that the first condition is responding to a sign digit indicating a positive signal and the second condition is responding to a negative signal, the converter of the present invention will have a maximum output for the most positive signal and a minimum of output for the most negative signal. Between these two extremes the output of the converter will be proportional to the actual value of the digital signal.

DESCRIPTION OF THE DRAWING

The present invention will be further described hereinafter with reference to the accompanying drawing wherein.

DETAILED DESCRIPTION

Figure 1:
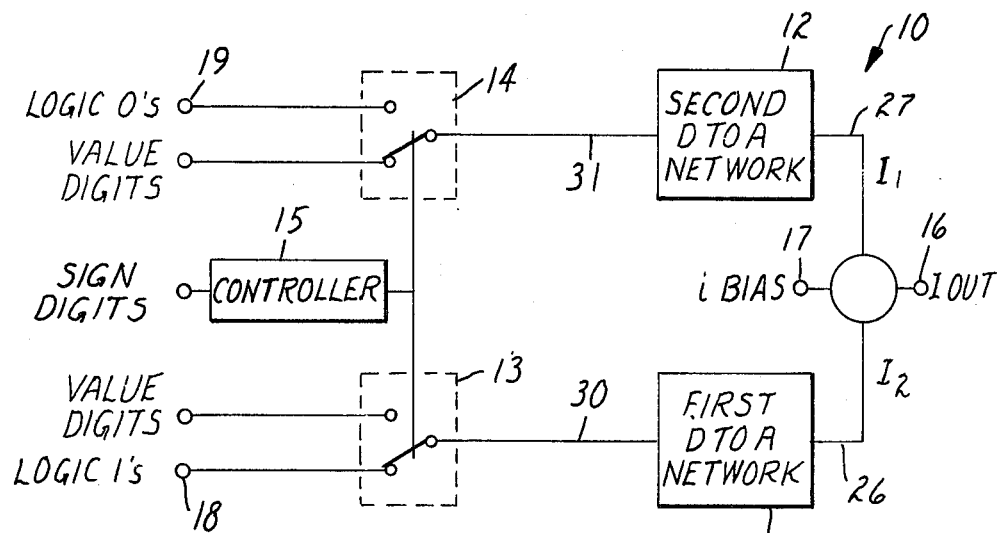
FIG. 1 is a schematic diagram of the digital to analog converter of the present invention.

The converter 10 according to the present invention is schematically illustrated in FIG. 1. This converter comprises a pair of identically configured digital to analog networks 11 and 12 respectively. Each of these networks 11 or 12 has a plurality of input connections 30 and 31 (represented by a single line), respectively, for digital data, and an output connection 26 and 27, respectively, from which an analog signal corresponding to the digital data can be derived. The first of these networks 11 has its input connections 30 electrically connected to a first circuit 13 which is able to direct either an input source 18 providing a logic "one", or the value digits of the digital data to the network 11. The second digital to analog network 12 is electrically connected to second circuit 14 which directs either the value digits or an input source 19 providing a logic "zero" to the network 12. Control means 15, which are responsive to the sign digits of the digital data, determine which of the inputs are directed to the respective digital to analog networks 11 and 12. The output signals of the two digital to analog networks 11 and 12 are then summed, with the combined output signal being available at terminal 16. As will be discussed, the summing network also contains a terminal 17 at which a DC bias current can be added to change the relative DC position and shape of the resulting output signal. When the circuits 13 and 14 are in the first position as indicated in FIG. 1, it can be seen that the first digital to analog network 11 is turned on, i.e. receiving a high level or logic "one" input, and the second digital to analog network 12 is responding to the changes in the value digits. The maximum output current is therefore flowing from the first digital to analog network 11. If the value digits are progressively increasing, the second digital to analog network 12 would respond by progressively increasing its output current until it also is completely turned on, the condition at which the converter 10 would have its maximum output. When the control means 15 switch the source of inputs, the value digits are fed to the first digital to analog network 11 and a low level or logic "zero" signal is fed to the inputs of the second digital to analog network 12. In this condition, the second digital to analog network 12 is turned off, and the output current of the first digital to analog network 11 is responding to the changes in the value digits. If it is again assumed that the value digits are progressively increasing, the output current of the network 11 will increase progressively as a function of the increasingly value digits. If the value digits are, however, progressively decreasing, the network 11 will be progressively turned off until its output current, and the output of the converter 10 as well, will be at a minimum value.

Figure 2:
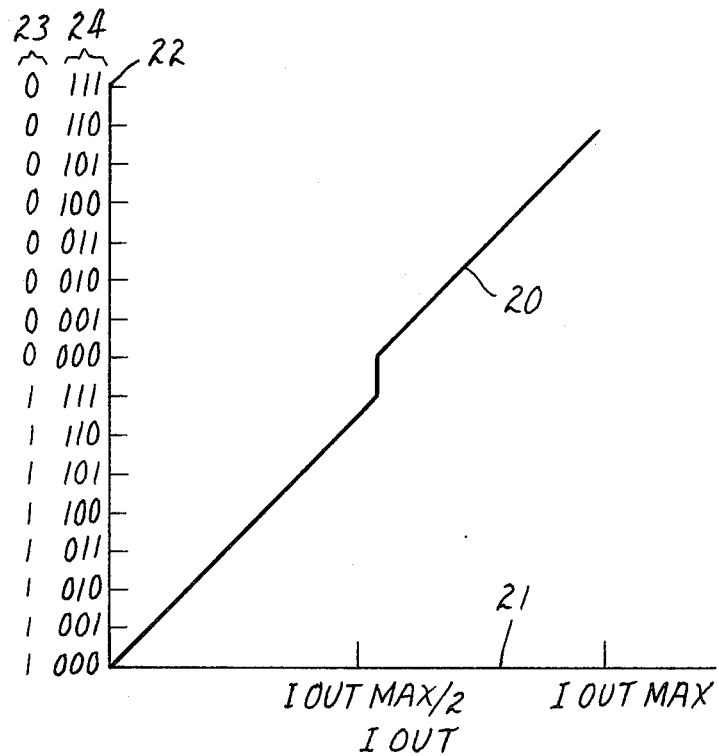
FIG. 2 is a graph of the transfer characteristics of the converter according to FIG. 1.

Assuming this to be a continuous process with the controller 15 responding to a change in polarity of the digital signal, occurring at the time described, the transfer characteristic 20 for the digital to analog converting circuit 10 can be represented as shown in FIG. 2. (Note—this graph shows the transfer characteristic without the addition of a bias current at terminal 17 as will be discussed.) The abscissa 21 of the graph shown represents the total output current of the converter 10, and the ordinate 22 represents the values of the digital data, separated into the sign digits 23 and the most significant three bits of the value digits 24. It should be noted that for a 12 bit converter, which is typical for the present circuit, there would be nine additional value digits (not shown) which form the input to the converter 10. As can be seen from this graph, it is necessary to translate the transfer characteristic 20 to the left by a distance equal to (I out max)/2 in order to make the output current bipolar and equally disposed about the ordinate 22. This can be done by adding a bias current at terminal 17 (see FIG. 1). This bias current would be equal in magnitude to one half of the maximum total current which can be produced by the digital to analog networks 11 and 12, but would, however, flow in the opposite direction as the output current flowing from the networks. With this addition, the transfer characteristic 20 will be translated to the left by a distance equal to this bias current at terminal 17. The zero crossover of the output current would then occur during a transition of the digital input signal between 0 000 and 1 111. As can also be seen from this transfer characteristic 20, substantially the same output current is present for the digital values of 0 000 and 1 111. (Note—this situation is exaggerated since only the three most significant value digits out of the total twelve value digits are shown.) This substantial equality of the current levels exists because at both levels one digital to analog network is approaching being completely turned on and the other network is approaching being completely turned off (Note—if all digits were shown, an interval would exist where one network would be fully on, and the other fully off). In order to make the transfer characteristic linear it is necessary to also add a bias current to the output current of each network 11 and 12 whenever the digital data is positive, i.e., the sign digit 23 is zero. This bias current should be equal in value to the change in output current which occurs for a change in the value of the least significant digit, i.e., the twelfth digit. In the preferred embodiment this is done by connecting an appropriate (see FIG. 3) resistor 40 between terminals 41 and 42. Whenever the sign digit 23 becomes zero, terminal 41 is high, and a current will flow through the resistor 40. The addition of the two bias currents explained above will result in a linear transfer curve which is symmetric about the ordinate 22.

Figure 3:
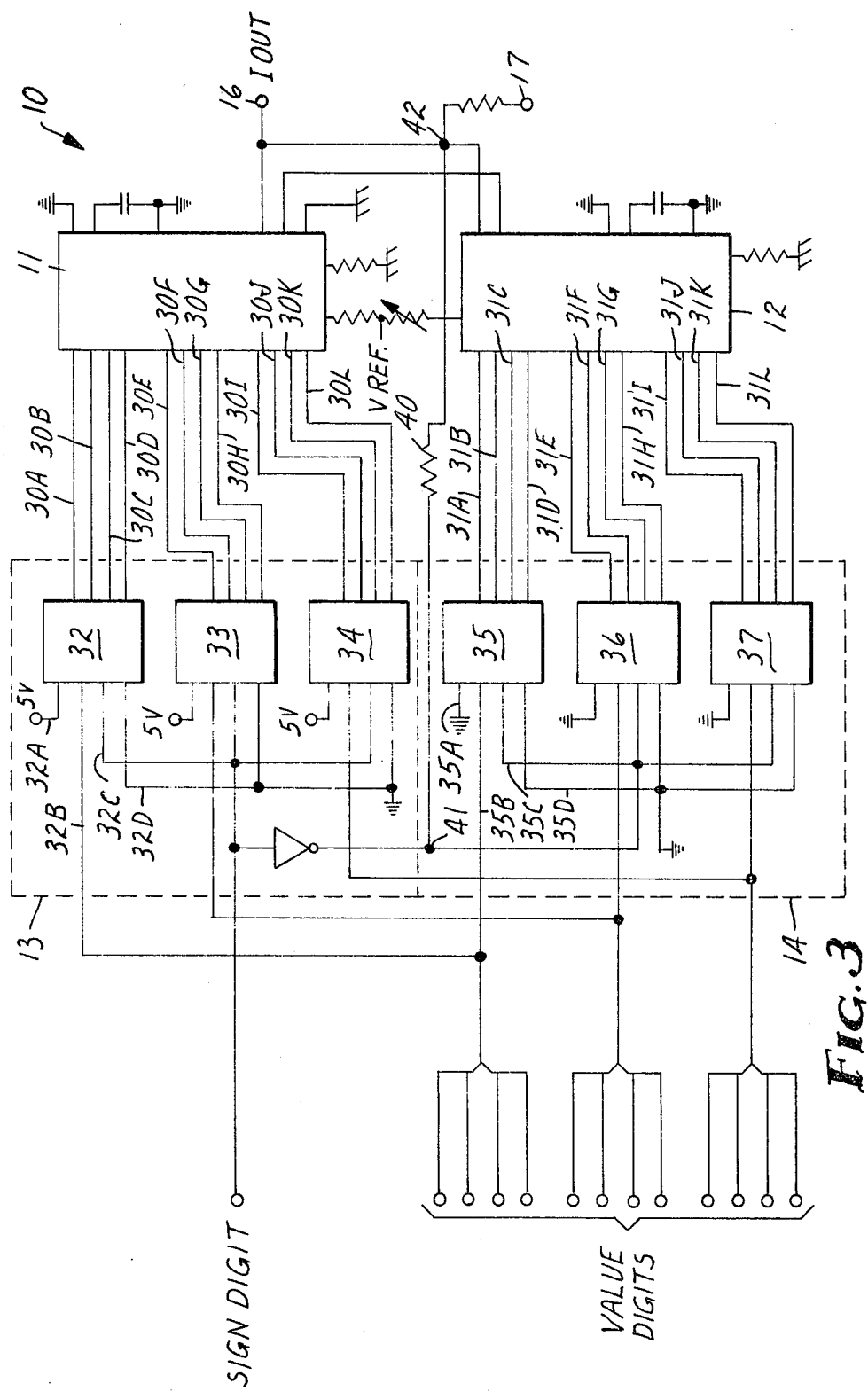
FIG. 3 is a circuit diagram of a first embodiment of the converter according to FIG. 1.

The operation of the present invention is best described by reference to FIG. 3 wherein is shown one embodiment of the digital to analog converter 10. A commercially available integrated circuit is used for each of the networks 11 and 12. This particular integrated circuit has a 12 bit capacity, however, depending upon the degree of accuracy which is required by this digital to analog converter 10, other networks having other capacities are equally viable. For a 12 bit capacity there are twelve inputs 30A through 30L or 31A through 31L. This embodiment also utilizes a plurality of identical integrated circuits for its circuits, designated generally 13 and 14. Each of these integrated circuits is a type SN 74LS157 data selector/multiplexer which is commercially available from Texas Instruments, Inc. These data selectors afford a 4-bit word to be selected from one of two inputs, and routed to a four terminal output. Thus, for a 12-bit digital to analog network, three data selectors must be utilized. The three data selectors for the first digital to analog network 11 are designated 32, 33 and 34. Similarly, the three data selectors for the second digital to analog network 12 are designated 35, 36 and 37. As has already been indicated, each of these data selectors has two sets of four-bit inputs. For the sake of simplicity, the drawing only shows a single line representing the combination of the four-bit inputs. Therefore, in regard to the first data selector 32, the first four bit input is designated 32A and the second four bit input is designated 32B. This same identification scheme is also true for the remainder of the data selectors. The three data selectors connected to their respective digital to analog networks 11 or 12 are identically configured. Therefore, a description is provided for only the first data selector (i.e. 32 or 35) within each group of three. This description will also apply to the other two data selectors which are connected to that particular digital to analog network 11 or 12. Each of the data selectors 32 and 35 contains two additional inputs designated 32C, 32D, and 35C, 35D respectively. These two inputs form part of the controller which is utilized to connect the alternative input sources to the corresponding digital to analog network 11 or 12. This particular integrated circuit has a function table which will select the A input when both the C input and the D input are low, and select the B input when the C input is high and the D input is low. When the D input is high, the resulting output of the data selectors will be a low voltage of a logic "zero".

The A inputs, i.e. 32A and 35A, are connected to a source which supplies a pre-determined reference voltage, and the B inputs, i.e. 32B and 35B, are the inputs for the twelve data bits, or value digits which are present in the incoming digital data to being converted. For the embodiment shown in FIG. 3, the reference voltage at 32A is sufficiently high to bring the network 11 to a logic "one" or on state. Contrastingly, the reference voltage at 35A is sufficiently low, i.e., grounded, to bring the network 12 to a logic "zero" or off state. The third input 32C of the data selectors connected to the first network 11, is connected to the sign bit or sign digit of the incoming digital data, and the fourth input 32D is grounded, or brought to logic "zero". For the data selectors connected to the second digital to analog network 12, the third input 35C is connected to the inverse of the sign digit of the incoming digital signal, and the fourth input 35D is connected to a voltage source bringing it to a logic "zero" state.

The logic scheme chosen to encode the digital data, uses a sign digit of zero to indicate a positive signal, and a sign digit of one to indicate a negative signal. Therefore, if the incoming digital data corresponds to a positive analog signal, the sign bit will be zero causing the input 32C to be zero. Since the input 32D is grounded (logic zero), the input 32A will be selected and the input to the first digital to analog network 11 will be logic "ones". The inverse of the zero sign bit is fed to input 35C. Since input 35D is grounded, the source input 35B is chosen and the digital data is delivered to the second digital to analog network 12. Alternatively, if the sign bit is one, representing a negative analog signal, input 32C is high and again the input 32D is low. The input 32B is therefore chosen and the value digits of the digital data are delivered to the first digital to analog network 11. The input 35C however becomes a logic "zero" due to the inverse of the sign bit, resulting in a logic "zero" being inputted to the second digital to analog network 12. Thus, for positive signals, the first digital to analog network 11 is continuously on and the second digital to analog network 12 is progressively turned on as a function of the increasing signal value. For negative signals, however, the second digital to analog network 12 is turned off and the first digital to analog network is progressively turned off as a function of the digital signal becoming more negative. As has already been described, this phenomenon is illustrated by the transfer characteristics shown in FIG. 2.

Figure 4:
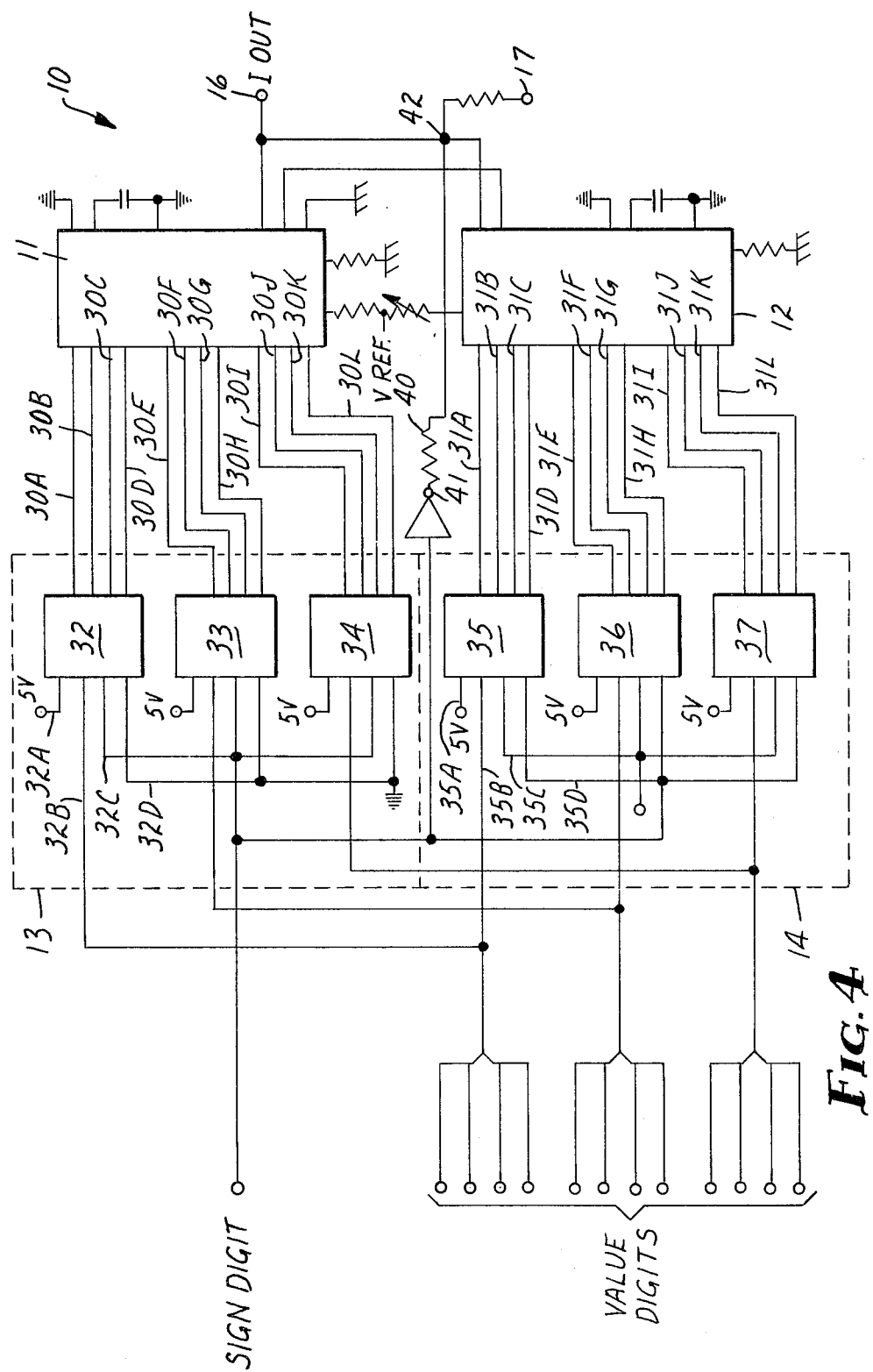
FIG. 4 is a circuit diagram of a second embodiment according to the present invention.

A variation of the present invention is shown in FIG. 4. Again the same networks 11 and 12, and data selectors 32 through 37 are utilized. As before, the B inputs are reserved for the input of digital data, the 32A input is connected to a logic "one" reference voltage, input 32C is connected to the sign digit, and input 32D is grounded. The A and the C inputs of the second set of data selectors, i.e., 35, 36, and 37, however, are both connected to a reference voltage sufficiently high to be a logic "one", and the sign digit is connected to the 35D input. In this configuration a sign digit of zero will cause 32C to be low. Since 32D is also low, the 32A input will be chosen and logic "ones" will be fed to the first network 11. The sign digit will also be connected to input 35D. Hence for a negative signal input 35D will be low. Since input 35C is always high, the input to the second digital to analog network 12 will be 35B, and the data will be fed to the second digital to analog network 12. For a negative signal the sign digit is 1. This results in put 32C being high. Since 32D is low, input 32B is chosen and the data is fed to the first network 11. The sign digit of one also causes input 35D to be high. Since input 35C is also high, logic zeros will be fed to the second network 12. Hence the result is the same as that described for FIG. 3.

Figure 5:
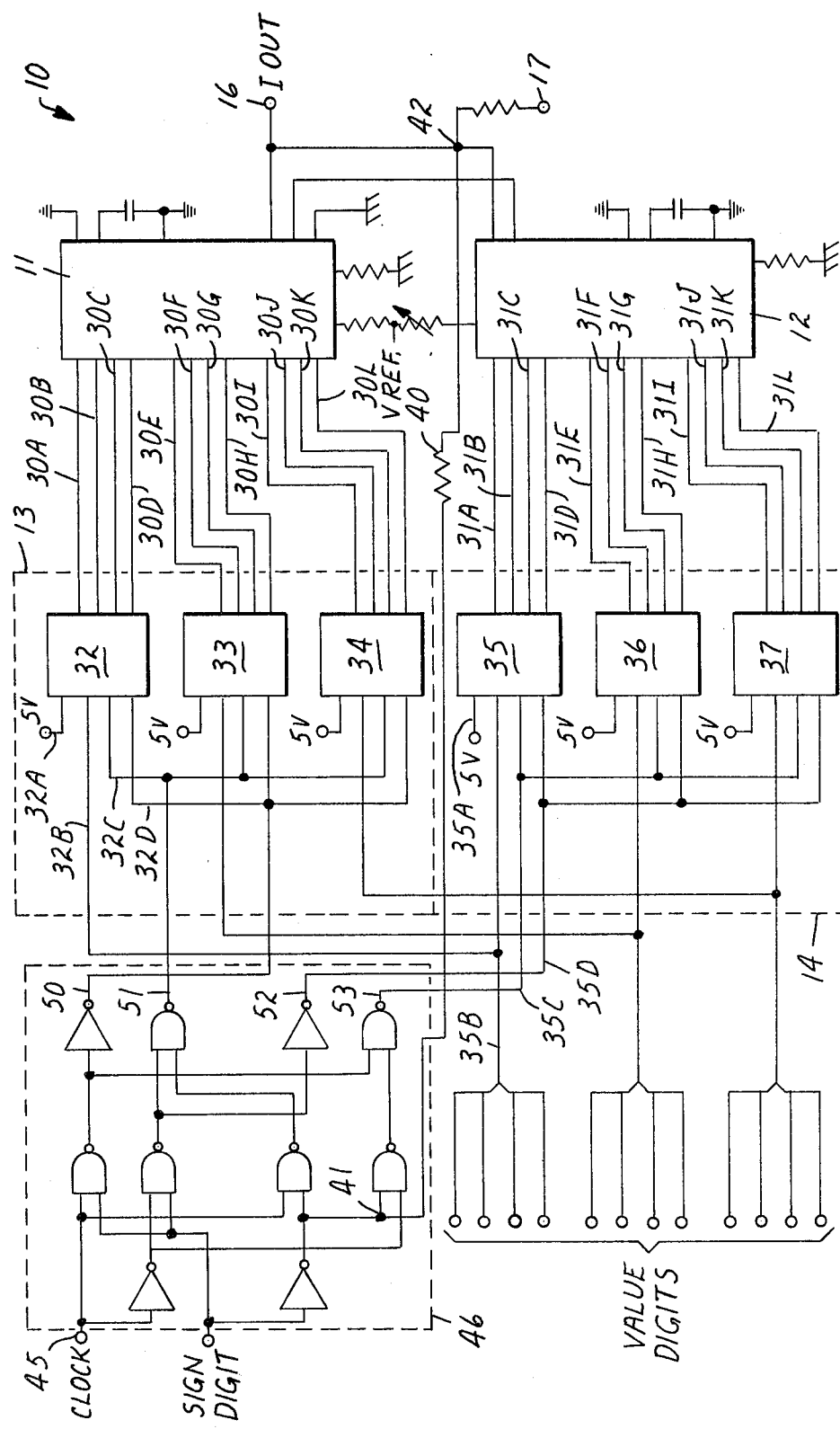
FIG. 5 is a circuit diagram of a third embodiment according to the present invention.

Although the present invention improves the ability of the digital to analog networks to convert the zero crossover information, there is still a concern for minor variations which might occur, e.g. even in the same manufacturing lot of networks, therefore FIG. 5 illustrates a third embodiment of the present invention wherein a similar circuit as that already described is shown. The third embodiment, however, contains additional circuitry which effectively serves to toggle or switch the two digital to analog networks 11 and 12 between their respective circuits 13 and 14. This toggling is done at a rate which is approximately one-half the sampling frequency which was originally used to create the digital data from its analog equivalent. This toggling of the digital to analog networks 11 and 12 is done to ensure that any discrepency between the two digital to analog networks 11 and 12, which might cause error or noise in the analog signal, will cause that noise or error at a known frequency, i.e. one-half the sampling frequency. This error or discrepancy can then be filtered out. For this purpose, a clock pulse is now added at terminal 45. This clock pulse has a frequency of one-half the sampling frequency as described. A configuration of NAND and NOT gates designated generally 46 form switches which in response to the sign digit and the clock pulse toggle the digital to analog networks 11 and 12. The actual conditions which are obtained by the gates for the various clock and sign bit conditions are indicated in the following table:

| Clock | Sign Bit | Terminal 50 | Terminal 51 | Terminal 52 | Terminal 53 |
|---|---|---|---|---|---|
| 1 | 0 | 0 | 1 | 0 | 0 |
| 0 | 0 | 0 | 0 | 0 | 1 |
| 1 | 1 | 1 | 0 | 0 | 1 |
| 0 | 1 | 0 | 1 | 1 | 0 |

In this embodiment terminal 50 is the 32D input, terminal 51 the 32C input, terminal 52 the 35D input, and terminal 53 the 35C input. Thus for a positive signal the first network 11 toggles between the data and logic "ones" while the second network 12 toggles between logic "ones" and the data. For a negative signal, however, the first network 11 toggles between logic "zeros" and data, while the second network toggles between the data and logic "zeros". As can be seen, this has the same transfer characteristic 20, but with the addition of the toggling function.

Having thus described several embodiments of the present invention, it will be understood that changes may be made in the size, shape and configuration of some of the parts or circuits described herein without departing from the present invention as recited in the appended claims.

What is claimed is:

1. A digital-to-analog converter for converting bipolar digital data having a series of binary digits including a sign digit and value digits, to its analog equivalent, said converter comprising:

a pair of digital-to-analog networks, each having a plurality of input connections for the value digits of the digital data and an output connection from which an analog signal corresponding to the digital data can be derived;

circuit means responsive to the sign digit and electrically connected to said digital-to-analog networks for directing the value digits to only one of said networks, and for establishing a first biasing condition for the networks wherein the digital-to-analog network not receiving the value digits is completely turned on and the digital-to-analog network receiving the value digits is turned progressively on or off as a function of the increase or decrease, respectively, in the relative value of the value digits, and for establishing a second biasing condition wherein the digital-to-analog network not receiving the value digits is completely turned off and the digital-to-analog network receiving the value digit is progressively turned off or on as a function of the decrease or increase, respectively, in the relative value of the value digits; and means electrically connected to said output connection of said digital-to-analog networks for summing the output signals, derived therefrom.

2. A digital-to-analog converter for converting bipolar digital data having a series of binary digits including a sign digit and value digits, to its analog equivalent, said converter comprising:

a pair of digital-to-analog networks, each having a plurality of input connections for the value digits of the digital data and an output connection from which an analog signal corresponding to the digital data can be derived;

first and second circuits; each comprising a first set of input terminals connected to a reference voltage, a second set of input terminals for the incoming value digits, a set of output terminals connected to said input connections of one of said digital-to-analog networks, means for connecting one of said sets of input terminals to said output terminals, and control means responsive to the sign digit for determining which of the alternative sets of input terminals are connected to said output terminals; and means electrically connected to said output connection of said digital-to-analog networks for summing the output signals derived therefrom.

3. A converter as claimed in claim 2 further comprising a terminal at which a DC signal having an opposite polarity to the output signals derived from said digital-to-analog networks can be injected, said terminal being electrically connected to said means for summing the output signals of said digital-to-analog networks.

4. A converter as claimed in claim 3 wherein said reference voltage for said first circuit has sufficiently high magnitude to be equivalent to a logic "1" and said reference voltage for said second circuit has sufficiently low magnitude to be equivalent to a logic "0".

5. A converter as claimed in claim 3 wherein said reference voltages for said first and said second circuits both have sufficiently high magnitudes to be equivalent to logic "1".

6. A converter as claimed in claim 5 wherein said control means includes two input connections, one of which receives the sign digit, and the other of which is connected to a control reference voltage, said control reference voltage for said first circuit having a sufficiently low magnitude to be equivalent to logic "0" and said control reference voltage for said second circuit having a sufficiently high magnitude to be equivalent to logic "1".

* * * * *